United States Patent [19]

Korsunsky et al.

[11] Patent Number: 4,872,845
[45] Date of Patent: Oct. 10, 1989

[54] RETENTION MEANS FOR CHIP CARRIER SOCKETS

[75] Inventors: Iosif Korsunsky; Kevin E. Walker; Robert W. Brown, all of Harrisburg, Pa.

[73] Assignee: AMP Incorporated, Harrisburg, Pa.

[21] Appl. No.: 191,635

[22] Filed: May 6, 1988

Related U.S. Application Data

[63] Continuation-in-part of Ser. No. 116,770, Nov. 30, 1987.

[51] Int. Cl.⁴ .............................................. H01R 23/72
[52] U.S. Cl. ...................................... 439/70; 439/330; 439/526
[58] Field of Search .................................. 439/68–73, 439/330, 331, 325–328, 350–358, 526

[56] References Cited

U.S. PATENT DOCUMENTS

| | | |
|---|---|---|
| 3,179,738 | 4/1965 | De Lyon . |
| 3,399,374 | 8/1968 | Pauza . |
| 3,905,665 | 9/1975 | Lynch ..................................... 339/17 |
| 3,951,495 | 4/1976 | Donaher et al. ...................... 439/330 |
| 4,349,238 | 9/1982 | Showman et al. ..................... 339/17 |
| 4,547,031 | 10/1985 | Korsunsky ............................ 339/17 |
| 4,623,208 | 11/1986 | Kerul et al. ............................ 339/17 |
| 4,752,248 | 6/1988 | Rudy .................................... 439/718 |

FOREIGN PATENT DOCUMENTS

0107906 9/1982 European Pat. Off. .
0163414 4/1984 European Pat. Off. .

Primary Examiner—Neil Abrams
Attorney, Agent, or Firm—Bruce J. Wolstoncroft

[57] ABSTRACT

Chip carrier sockets (2) have terminals (4) provided therein, the terminals (4) comprising leg portions (34) with first resilient arms (18) and second resilient arms (20) pivotally attached thereto. The first resilient arms (18) have contact surfaces (26) provided on free end sections (22) thereof. The contact surfaces (26) are provided to electrically engage leads (6) of the chip carrier (8). A cover (12) is provided to cooperate with the chip carrier and to act as a protective handler for the chip carrier. Retention means are positioned on the chip carrier socket (2) to cooperate with the cover (12), thereby providing the contact force required to insure that a positive electrical connection is effected between the leads (6) and the terminals (4). The resilient configuration of the retention means insures that the retention means will not fail under normal stresses associated therewith.

19 Claims, 6 Drawing Sheets

RETENTION MEANS FOR CHIP CARRIER SOCKETS

CROSS REFERENCE TO RELATED APPLICATION

This application is a continuation-in-part of U.S. patent application Ser. No. 116,770 filed Nov. 3, 1987.

FIELD OF THE INVENTION

The invention is directed to an improved retention means for use with a chip carrier socket and the like. The retention means insures that a chip carrier will be maintained in the chip carrier socket and that the chip carrier socket will be maintained in a closed position.

BACKGROUND OF THE INVENTION

Integrated circuits are commonly mounted in chip carriers which are bodies of insulating material having side surfaces to which conductors from the integrated circuit extend. Traditionally, terminal pads are provided on the side surfaces of the chip carrier body and contact is made with these pads to connect the integrated circuit to conductors on a substrate, such as a ceramic substrate or a circuit board. Electrical connection is usually established with the terminal pads on the chip carrier by means of a chip carrier socket which comprises a socket body having a recess which receives the chip carrier and contact terminals in surrounding relationship to the recess so that when the chip carrier is placed in the recess, the contact terminals electrically engage the terminal pads of the chip carrier.

Notwithstanding the relatively small size of the chip carrier socket and the contact terminals in the socket, it is necessary that each terminal be capable of exerting contact force on a terminal pad in a chip carrier in the range of about 200 to 400 grams in order to establish good electrical connection between the contact terminal and the terminal pad on the chip carrier, particularly if the terminal pad is tin plated rather than gold plated. It should also be noted that chip carriers and chip carrier sockets are subject to the dimensional variations which all mass produced parts are subjected to. These dimensional variation result from manufacturing tolerances. However, even with dimensional variations, the design and performance requirements discussed briefly above must be satisfied even in "worst case" conditions. For example, the minimum 200 gram contact force required for each contact must be met even if the particular terminal pad that a contact terminal engages is at the lower end of the tolerance range and the contact terminal similarly is at the lower end of the tolerance range for the parts.

For the new emerging family of modified gull wing chip carriers, a new socket is required than is found in the prior art. The contact force, etc. discussed above must remain the same in order to insure that a proper electrical connection is maintained.

It is therefore essential that a chip carrier socket be provided with the capability to insure that the appropriate force be exerted on the contact terminals. It is also extremely important that the contact force required for proper operation be provided in such a manner as to not require special tools for operation. The present invention is specifically directed to the achievement of an improved retention means which is capable of providing a reliable electrical connection between the contact terminals and the contact pads.

SUMMARY OF THE INVENTION

For the new emerging family of modified gull wing chip carrier, a new chip carrier socket is required. Particularly, for the chip carriers that have large variations of the critical dimensions, which causes the leads of the chip carrier to not be uniformly positioned. It is therefore necessary to have a chip carrier socket with improved retention means to insure that a reliable electrical connection is effected.

The invention is directed to a chip carrier socket having terminals provided therein. The chip carrier socket provides the electrical connection required between a chip carrier housed in a protective handler and a printed circuit board.

The chip carrier socket is characterized in that portions of a first major surface of the housing of the chip carrier socket are resilient retention areas. Respective sides of the resilient retention areas are integral with the first major surface, while the remaining sides of the resilient retention areas are spaced from the first major surface.

First portions of the resilient retention areas are movable from a first position, in which the first portions are coplanar with the first major surface, to a second position, in which the first portions are not coplanar with the first major surface. Resilient projections are integral with and extend from the resilient retention areas. The resilient projections extend beyond the second major surface. Whereby as the resilient projections have a force applied thereto, the resilient projections are moved, causing the resilient retention areas to move from the first position toward the second position, providing the strength required to prevent the failure of the resilient projections.

DETAILED DESCRIPTION OF THE INVENTION

The figures show a chip carrier socket 2 containing terminals 4 which engage contact leads 6 of a chip carrier 8 and which are soldered or otherwise connected to conductors on or in a substrate 10. An individual terminal 4 will first be described and structural details of the chip carrier socket 2 and a cover 12 used in cooperation therewith will then be described.

Each terminal 4 (FIG. 2) is a complanate or flat member of the type commonly produced by etching or by stamping sheet metal so that it has oppositely facing major surfaces and edges extending between the major surfaces. The thickness of the terminals may vary depending upon the requirements in a particular situation.

Figures 1, 2:
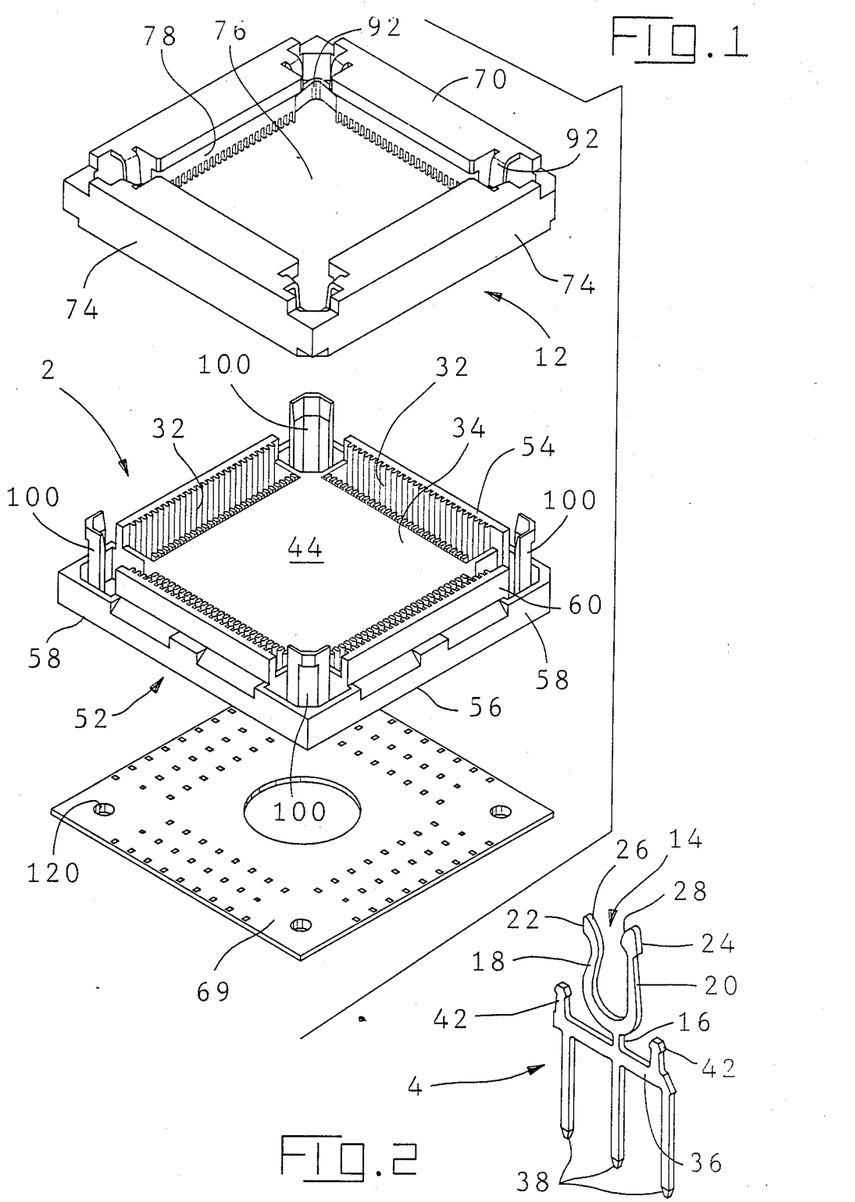
FIG. 1 is an exploded perspective view of a chip carrier socket of the present invention.
FIG. 2 is an enlarged perspective view of a terminal which is provided in the chip carrier socket.

As is best shown in FIG. 2, each terminal 4 comprises a resilient portion 14 having a flexible leg 16 extending from the resilient portion 14. The resilient portion 14 has a rounded, U-shaped configuration which is comprised of two resilient arms 18, 20. The first resilient arm 18 and the second resilient arm 20 have free ends 22, 24 which are spaced from each other but which are flexed relatively away from each other when the terminal 4 is stressed. As is best shown in FIGS. 3 and 4, resilient arm 20 is slightly longer than resilient arm 18.

Figure 3:
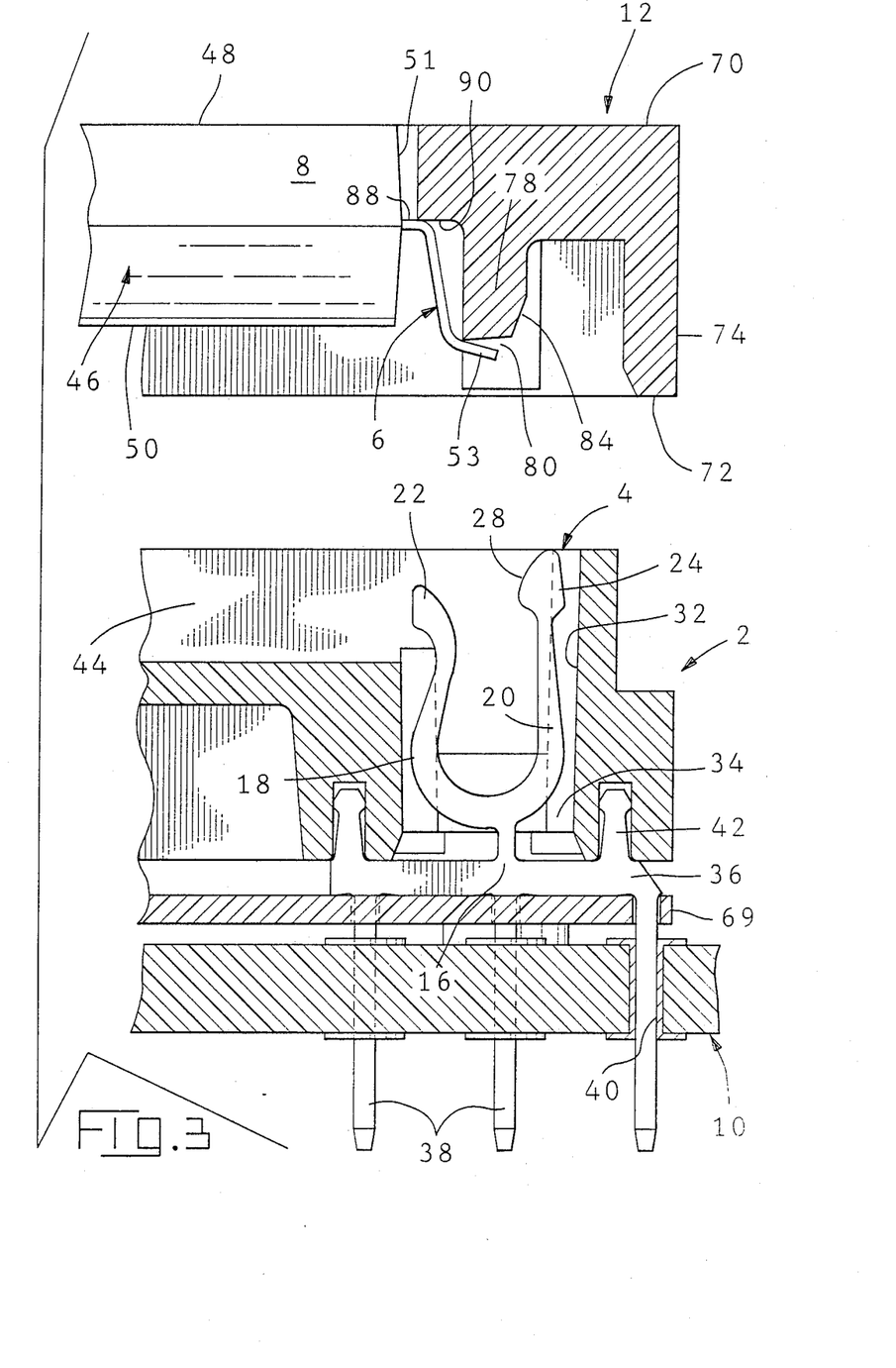
FIG. 3 is a partial cross sectional view of the chip carrier socket showing the terminals of the socket prior to the insertion of the cover-chip carrier subassembly therein.
Figure 4:
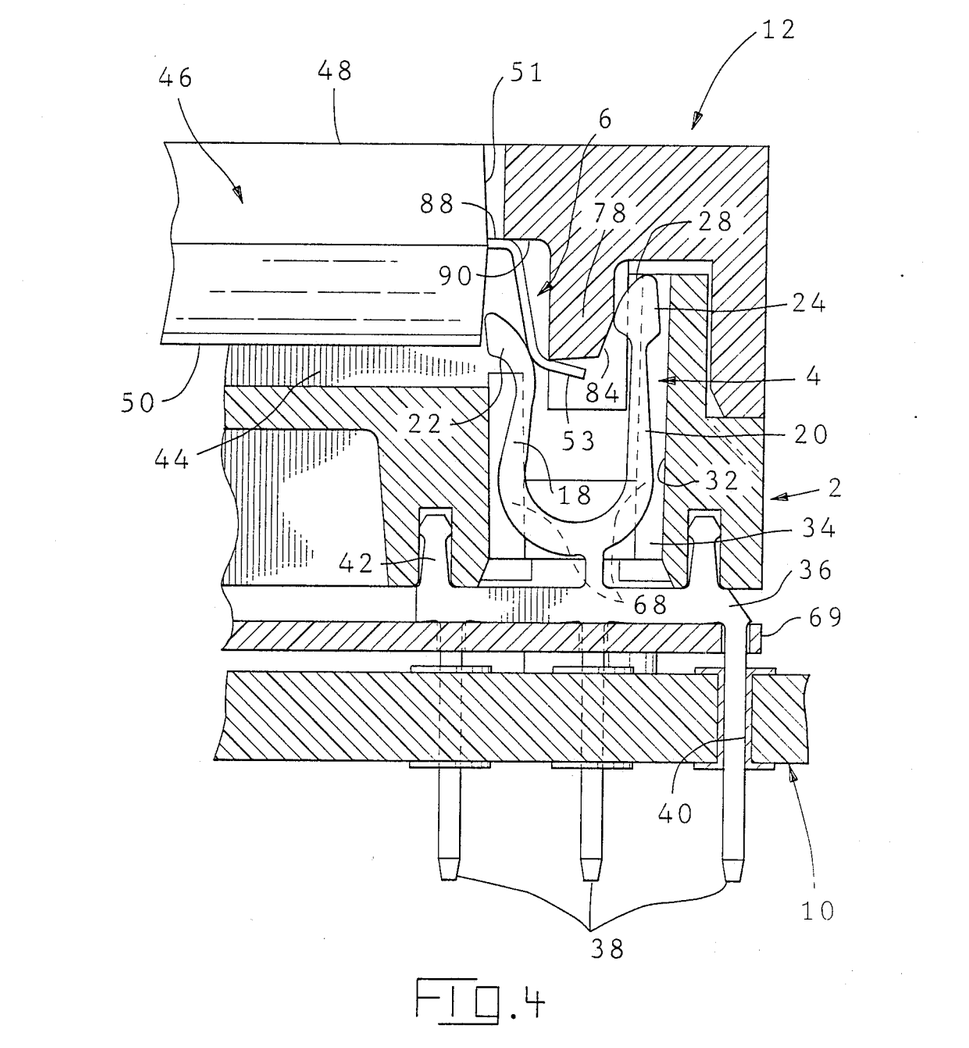
FIG. 4 is a partial cross sectional view similar to that of FIG. 3, showing the chip carrier socket after the cover-chip carrier subassembly has been inserted therein.

The first resilient arm 18, of each terminal 4, is a contact arm and has a rightwardly facing, as viewed in FIG. 3, contact surface 26 which cooperates with a respective lead 6 of the chip carrier 8. The second resilient arm 20 has a leftwardly facing, as viewed in FIG. 3, lead-in surface 28 which helps to guide the cover 12 into place. It should be noted that neither of the free ends 22, 24 nor any portion of the resilient arms 18, 20 is in engagement with side surfaces 32 of a terminal receiving cavity 34 of socket 2 when the terminal 4 is in an unstressed or first position, as shown in FIG. 3.

The U-shaped resilient portion 14 is pivotally mounted on leg 16. This allows the U-shaped resilient portion 14 to adjust for any dimensional variation or misalignment of the chip carrier 8 when the chip carrier is inserted into the socket 2. Dimensional variation or misalignment of the chip carrier 8 can cause the component lead positions to vary. Therefore, it is important that the U-shaped resilient portion 14 of each terminal 4 be free to pivot in order to compensate for this varied lead position. Consequently, as the terminals 4 of the socket 2 can adjust to the varied position of the leads 6 of the chip carrier 8, a positive electrical connection will be effected and maintained between each lead 6 and the respective terminal 4.

The leg 16 of each terminal 4 is integrally attached to a horizontal bar 36 from which a number of mounting portions 38 extend downward, as is shown in FIG. 2. As is indicated in FIGS. 3 and 4, all but one of these mounting portions 38 are removed from any given terminal 4, thereby providing the required footprint to match the holes 40 in the substrate 10.

Each horizontal bar 36 has two support portions 42 which extend upward, in the same direction as leg 16. These support portions 42 are provided to cooperate with the housing of the socket 2 to provide support for the side walls 32 of the terminal receiving cavity 34.

When the terminals 4 are contained in the chip carrier socket 2 which in turn is mounted on a substrate 10 and a chip carrier 8 is placed in a chip carrier receiving recess 44 of the chip carrier socket 2, leads 6 and a portion of cover 12 extend between free ends 22, 24 of resilient arms 18, 20, as shown in FIG. 4. The effect is to impose a force on the free ends 22, 24 of the resilient arms 18, 20 of the terminals 4. As a result of the imposition of this force, the resilient arms 18, 20 function as a spring system and the arms 18, 20 are flexed relatively away from each other. The stresses induced in the terminal 4 as a result of the force are largely concentrated in the arms 18, 20, and only a very minor portion of the force is transmitted through the leg 16 to the horizontal bar 36 and to the mounting portions 38. This is a highly desirable feature because a transfer of large forces to the mounting portions 38 would create stresses on the relatively weak solder joints. These stresses would result in the failure of the connection. Consequently, it is extremely important to prevent large stresses from being transferred to the mounting portions 38.

Turning now to FIG. 3, the previously identified chip carrier 8 comprises, in the disclosed embodiment, a generally square chip carrier body 46 having upper and lower major surfaces 48, 50 and side surfaces 51. Side surfaces 51 extend between first major surface 48 and second major surface 50. Side surfaces 51 are slightly bowed, as is best shown in FIGS. 3 and 4. The leads 6 extend into the body 46 and are connected to the integrated circuit chip (not shown) therein. These leads 6 extend from side surfaces 51 of body 46 in a generally downward fashion, (modified gull wing configuration) as is shown in the FIG. 4. The end portions 53 of leads 6 are bent such that the bottom surface of end portions 53 are approaching parallel to the lower major surface 50.

Chip carrier 8 has projections 55 extending from the corners thereof. Projections 55 extend from the first major surface 48 to the second major surface 50. The sides of projections 55 have the same bowed configuration as side surfaces 51.

Referring to FIG. 1, the chip carrier socket 2 comprises a socket body 52 having first and second major surfaces 54, 56 and side surfaces 58. The side surfaces 58 have an offset portion 60 proximate the first major surface 54, the offset portion 60 being provided to cooperate with the cover 12, as will be discussed. Chip carrier receiving recess 44 extends from the first major surface 54 toward the second major surface 56 and has recess side surfaces which correspond to respective side walls 32 of terminal receiving cavities 34 which extend to the second major surface 56 of socket 2.

Terminal-receiving cavities 34 are provided in the recess 44 and extend from the first major surface 54 to the second major surface 56. Each cavity 34 extends from proximate a corner of the recess 44 to proximate an adjacent corner of the recess 44. Cavities 34 have a general rectangular shape. Side-by-side slots 68 are provided on side walls 32. These slots 68 cooperate with the respective terminals 4 to align the terminals 4 in the proper position. As is shown in FIGS. 3 and 4, the terminals 4 are positioned in the slots 68, thereby preventing the terminals 4 from engaging each other, which in turn prevents the terminals 4 from shorting. It should be noted, that in order for chip carrier 8 to be inserted into chip carrier receiving recess 44, respective inner side walls 32 can not extend all the way to the first major surface 54.

As is best shown in FIGS. 3 and 4, terminals 4 do not contact side walls 32 when the terminals 4 are in an unstressed position. However, the spacing between side walls 32 is dimensioned such that the side walls 32 act as overstress means as the terminals 4 are stressed, i.e.

sidewalls 32 prevent terminals 4 from bending far enough to take a permanent set. Consequently, side walls 32 of terminal receiving cavities 34 prevent the terminals 4 from taking a permanent set which would result in an ineffective electrical connection. In order to provide the side walls 32 with enough support to prevent the overstress of the terminals 4, the support members 42 which extend from the horizontal bars 36 of the terminals 4 are positioned in the housing 52 of the chip carrier socket 2. The positioning of terminals 4 allows the strength of the metal terminals 4 to reinforce the strength of the plastic housing 52, thereby providing the side walls 32 with the support necessary to prevent the overstress of the terminals 4.

Mounting portions 38 of terminals 4 extend from the second major surface 56 of chip carrier socket 2. A protective strip 69 is provided proximate the ends of mounting portions 38. Protective strip 69 cooperates with mounting portions 38 to maintain mounting portions 38 is proper position and to prevent the bending of mounting portions 38. As chip carrier socket 2 is inserted on the circuit board 10, protective strip 69 is moved along mounting portions 38 until protective strip 69 is proximate second major surface 56, thereby allowing mounting portions 38 to be inserted into circuit board 10.

Figure 5:
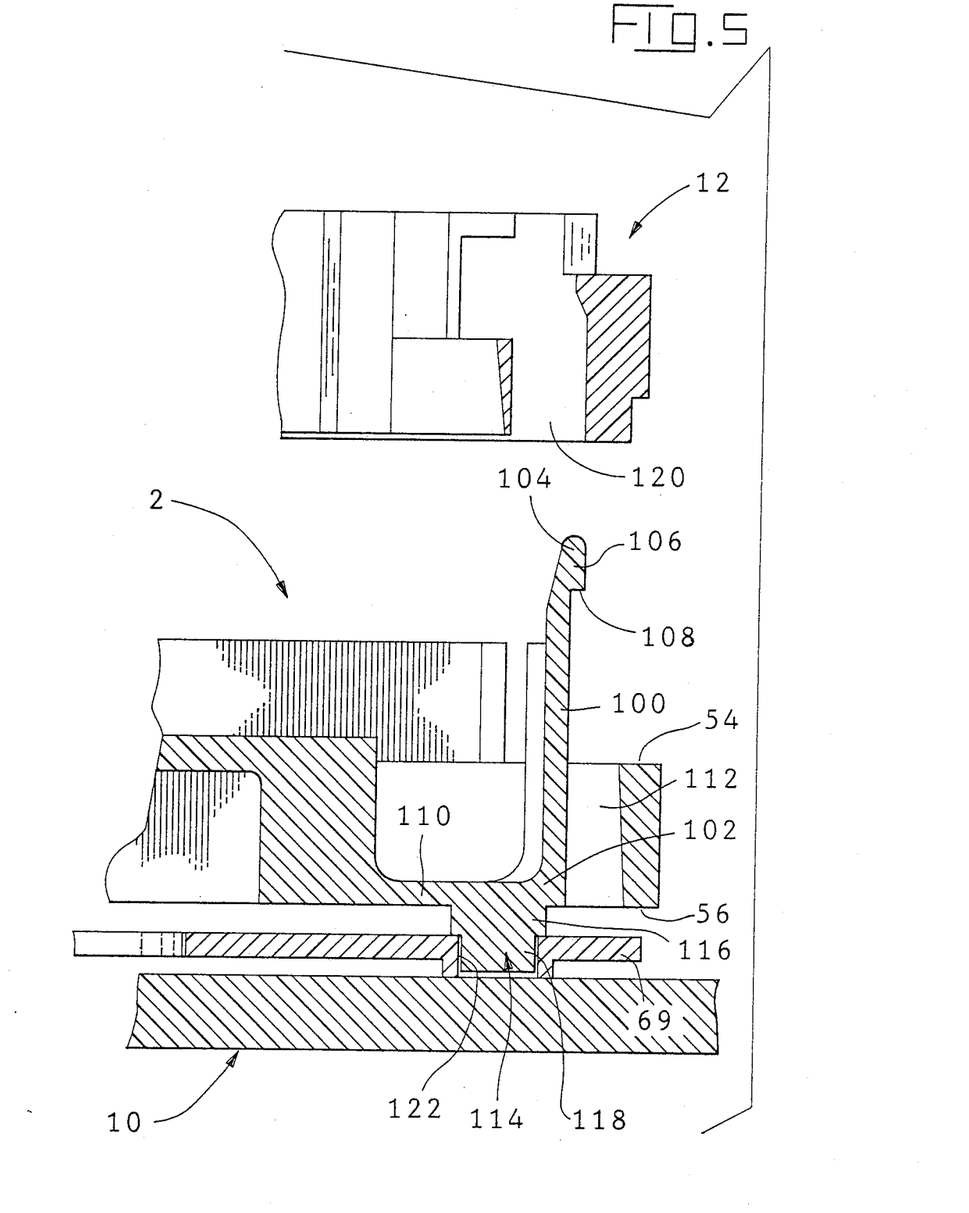
FIG. 5 is a cross section view of the chip carrier socket showing the latch means prior to the insertion of the cover-chip carrier subassembly therein.
Figure 6:
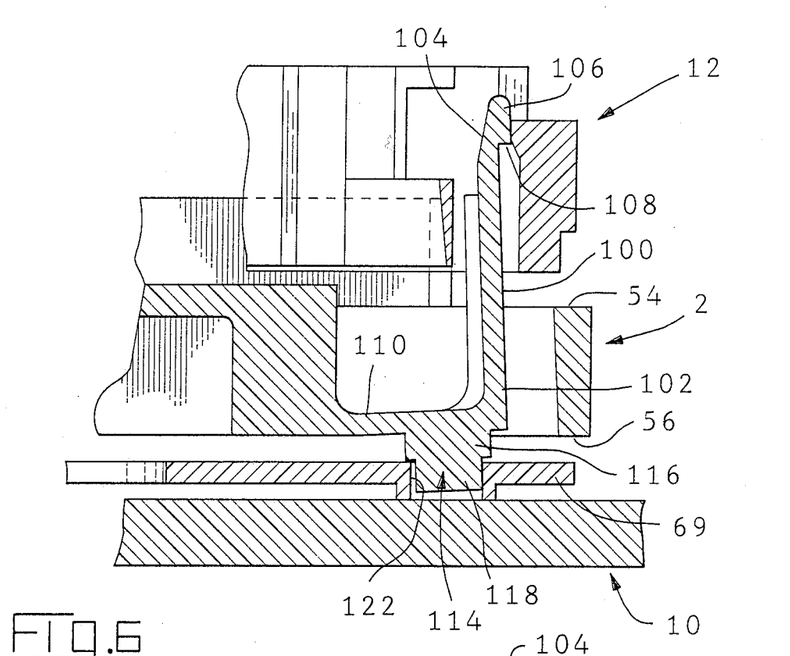
FIG. 6 is a view similar to that of FIG. 5, showing the latch means as the subassembly is inserted onto the chip carrier socket.
Figure 7:
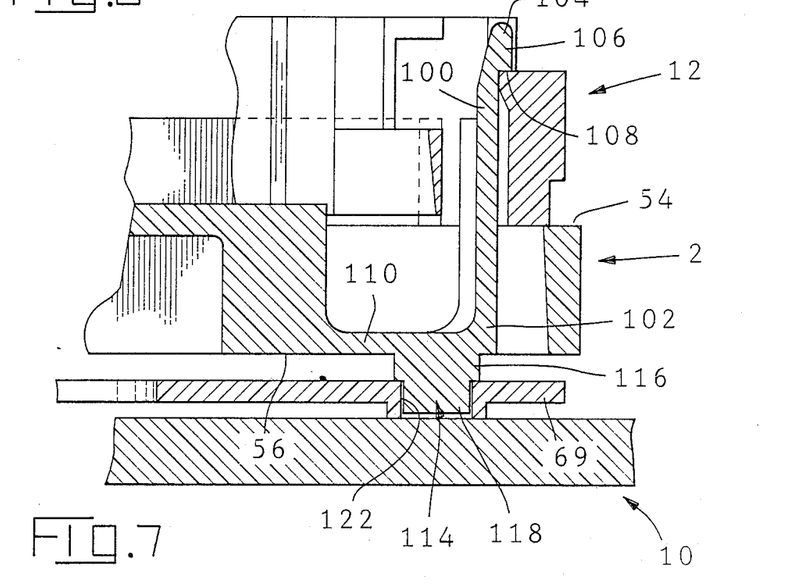
FIG. 7 is a view similar to that of FIG. 5, showing the latch means after the subassembly is fully inserted onto the socket.
Figure 8:
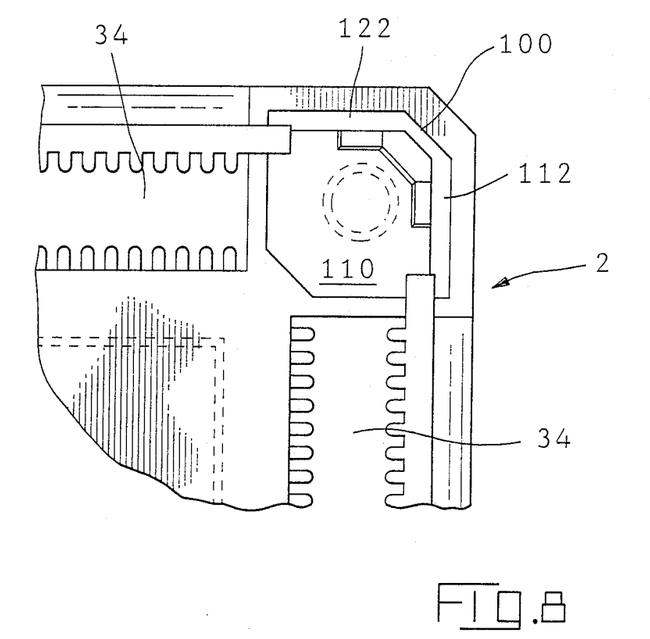
FIG. 8 is a top plan view of a respective latch arm of the chip carrier socket.

Chip carrier socket 2 has latching arms 100 provided proximate the corners of socket body 52, as is shown in FIG. 1. As is shown in FIGS. 5 through 7, latching arms 100 extend from second major surface 56 beyond first major surface 54. When viewed from above, as is shown in FIG. 8, latching arms 100 have a general U-shaped configuration. Each latch arm 100 has a fixed end 102, which is integral with a portion of second major surface 56, and a free end 104. Provided proximate each free end 104 is a latch 106. A shoulder 108 of each latch 106 cooperates with the cover 12 to maintain the cover in position.

As is shown in FIGS. 5 through 7, fixed ends 102 of latch arms 100 are integral with a retention member 110 of second major surface 56. In the embodiment shown, retention members 110 have openings 112 provided on two sides thereof, with the remaining two sides of the retention members being integral with the socket body 52 of the chip carrier socket 2 (FIG. 8). As shown in FIG. 5, alignment projections 14 extend downward from retention members 110, away from first major surface 54. Alignment projections 114 are generally cylindrical in shape. First portions 116 of projections 114 have a larger diameter than second portions 118. The second portions 118 of projections 114 cooperate with openings 122 provided in protective strip 69. As is shown in the drawings, openings 122 have a larger diameter than second portions 118. This allows projections 114 to move relative to protective strip 69, as will be discussed.

Referring to FIG. 1, cover 12 cooperates with the chip carrier 8, to prevent damage to the leads 6 of the chip carrier 8. Cover 12 is comprised of a first major surface 70, a second major surface 72, and side surfaces 74 extending therebetween. A chip carrier receiving recess 76 is provided in cover 12. The chip carrier receiving recess 76 extends from the first major surface 70 to the second major surface 72.

Extending in the recess 76 are chip carrier protective arms 78 which cooperate with the leads 6 of the chip carrier 8, as shown in FIGS. 3 and 4. Each lead 6 of chip carrier 8 is positioned in a slot 80 of arm 78. These slots 80 are provided to prevent leads 6 from electrically engaging one another, and also to provide protection to the leads 6, preventing the leads 6 from being damaged as the chip carrier 8 is inserted into the chip carrier socket 2.

As is best shown in FIGS. 3 and 4, protective arms 78 have surfaces 82 which cooperates with second resilient arms 20. Lead-in surfaces 84 are provided on arms 78 proximate the second major surface 72.

Chip carrier 8 is inserted into the cover 12 through the second major surface 72 thereof. Insertion of the chip carrier 8 continues until leading surfaces 88 of the leads 6 engage surfaces 90 of slots 80. This engagement prevents the chip carrier 8 from being further inserted in cover 12.

Figure 9:
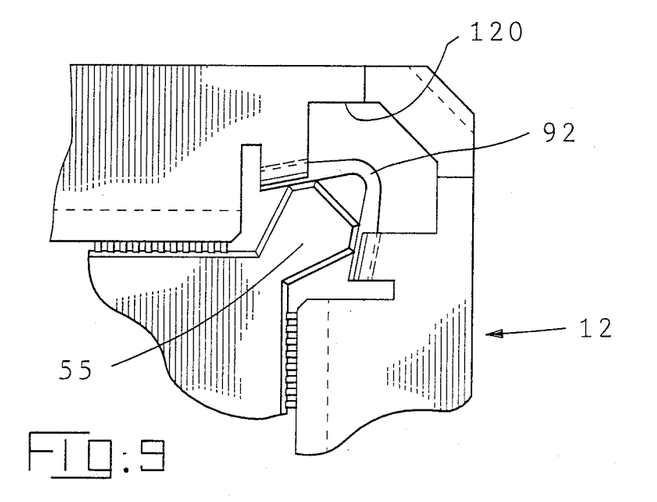
FIG. 9 is a top plan view of a respective securing arm of the cover.

The chip carrier 8 is maintained in the cover 12 by the cooperation of the projections 55 of the corners of the chip carrier socket 2 and securing arms 92 of the cover 12, as is best shown in FIG. 9. As is shown in FIG. 9, resilient securing arms 92 engage respective surfaces of projections 55 of the chip carrier 8. These respective surfaces are angled. Consequently, as the chip carrier 8 is inserted into the cover 12, the resilient securing arms 92 will provide enough frictional engagement to prevent the chip carrier 8 from falling out of the recess 76 of the cover 12. Provided proximate securing arms 92 are openings 120. Openings 120 extend from first major surface 70 through second major surface 72.

As is shown in FIG. 1, securing arms 92 are provided in the corners of cover 12. When viewed from above, as is shown in FIG. 9, each securing arm 92 has a U-shape, the ends of which are integrally attached to the cover 12. This type of configuration allows the securing arms 92 to have the resilient characteristics required to insure that the chip carrier 8 is maintained in the cover 12. However, the configuration of the securing arms 92 also provides the strength characteristics required to insure that the securing arms 92 will be reliable over many insertions. As the ends of securing arms 92 are fixed, the insertion of the chip carrier 8 into the cover 12 causes the securing arms 92 to be engaged by the projections 55 of cover 12. This engagement causes securing arms 92 to deflect, to allow the projections 55 to be inserted therein. This deflection can cause failure of the securing arms, if the securing arms are not properly designed. With the ends of the securing arms 92 fixed in place, the securing arms have a twisting, pivoting, resilient motion, which allows the securing arms 92 to have the strength and resilient characteristics required to insure for proper operation over many cycles.

In operation, the chip carrier 8 is inserted into the cover 12 and maintained therein, as was described. The chip carrier and cover subassembly is then inserted into the chip carrier socket 2. This process is shown in FIGS. 3 and 4. FIG. 3 shows the various parts just prior to insertion. As can be seen the terminals 4 of the chip carrier socket 2 are in an unstressed position. It should be noted that the downward force needed to insert the chip carrier-cover subassembly into the chip carrier socket 2 is applied to the cover. It should be noted that as this insertion occurs, leads 6 of chip carrier 8 are forced to conform to the shape of the slots 8 of the cover 12, as shown in FIG. 4. This insures that leads 6 will be in engagement with cover 12, thereby insuring the force applied to the leads 6 by the resilient arms 18 will be absorbed by the cover 12. Consequently, the fragile leads 6 of the chip carrier 8 are not damaged as insertion occurs, due to only minimal forces being directed at the leads.

As insertion occurs, leads 6 and protective arms 78 are inserted between the resilient arms 18, 20 of the terminals 4. However, as the width of the leads 6 and protective arms 78 is greater than the distance between the free ends 22, 24 of the resilient arms 18, 20, the resilient arms 18, 20 are forced apart. This force insures that as the insertion continues, the leads 6 will frictionally engage the contact surfaces 26 of the resilient arms 18. In other words, a contact wipe action will occur as insertion takes place.

As insertion continues, lead-in surfaces 84 of protective arms 78 will move past lead-in surfaces 28 of resilient arms 20, thereby allowing resilient arms 20 to move toward their unstressed position.

It is extremely important to note that although resilient arms 20 are allowed to move toward the unstressed position, the terminals 4 never reach the unstressed position when the protective arms 78 and leads 6 are inserted therein. Consequently, a force exists at all times between the leads 6 and the contact surfaces 26 of terminals 4, thereby insuring that a positive electrical connection is maintained.

Cover 12 is maintained in position on socket 2 by the cooperation of latch arms 100 and openings 120. The movement of latch arms 100 as cover 12 is inserted onto socket 2 is shown in FIGS. 5 through 7. As can be seen in FIG. 6 the insertion of cover 12 onto socket 2 causes latch arms 100 to resiliently deform. This resilient deformation would be enough to cause failure of the latch arm in many of the prior art connectors. However, latch arms 100 are reinforced by retention members 110. This cooperation of retention members 110 with latch arms 100 prevents the failure of latch arms 100.

As latch members 100 are forced to resiliently deflect, retention members 110 are also caused to deflect. The resilient characteristics of retention members are due to the positioning of openings 112 along the sides of the retention members. The openings 112 allow the retention members to resiliently deform as the latch members 100 are resiliently deformed, as illustrated in FIG. 6. This is an important result because the possibility of failure in the latch arms 100 is reduces. In other words, the forces associated with the insertion of the cover onto the socket, are distributed between the latch arms 100 and the retention members 110. Therefore, the forces associated with the insertion of the cover onto the socket are not enough to prevent a failure of either the latch arms or the retention members.

Upon complete insertion, shoulders 108 of latches 106 are resiliently returned to an unstressed position, such that shoulders 108 cooperate with first major surface 70. Thus, cover 12 is maintained in position until latch arms 100 are released.

This configuration of latch arms 100 provides the advantage of increase reliability over many cycles. Therefore, the covers can be reused if required, thereby reducing costs. Another advantage is that no tools are required for insertion or removal of the cover or the chip carrier. This makes use of the socket in the field a much more practical solution.

Changes in construction will occur to those skilled in the art and various apparently different modifications and embodiments may be made without departing from the scope of the invention. The matter set forth in the foregoing description and accompanying drawings is offered by way of illustration only.

We claim:
1. A chip carrier socket comprising:
a chip carrier receiving member having a chip carrier receiving opening extending therethrough, the chip carrier receiving opening having apertures provided proximate thereto for receiving resilient means therein;
a housing member having a first major surface and a second major surface, resilient securing portions provided on the first major surface, resilient means extend from, and are integral with the resilient securing portions, the resilient members extend beyond the second major surface,
each of the resilient securing portions being integral with the first major surface of the housing member on a plurality of sides thereof, the resilient securing portion being spaced from the first major surface on a plurality of sides thereof,
whereby as the chip carrier receiving member is moved into engagement with the housing member, the resilient means is caused to resiliently deform, which in turn causes the resilient securing portion to resiliently deform, and after the chip carrier receiving member is positioned in place on the housing member, the resilient means is allowed to moved to an unstressed position, thereby securing the chip carrier receiving member to the housing member.

2. A chip carrier socket as recited in claim 1 wherein the chip carrier receiving member has resilient chip carrier retention means provided proximate the corners thereof, the chip carrier retention means providing the retention force required to maintain the chip carrier in the chip carrier receiving recess.

3. A chip carrier socket as recited in claim 2 wherein the chip carrier retention means has ends which are fixed to walls of the chip carrier receiving member, and a midportion which is spaced from the walls of the chip carrier receiving member, such that as the chip carrier is inserted into the chip carrier receiving recess, the corners of the chip carrier cooperate with the chip carrier retention means to cause the retention means to resiliently twist and pivot as the insertion occurs.

4. A chip carrier socket as recited in claim 3 wherein the chip carrier retention means has a generally U-shaped configuration.

5. A chip carrier socket as recited in claim 1 wherein the resilient means are latch arms which are provided proximate the corners of the housing members.

6. A chip carrier socket as recited in claim 5 wherein free ends of the latching arms have shoulders which cooperate with the chip carrier receiving member to maintain the chip carrier receiving member in position with respect to the housing member.

7. A chip carrier socket as recited in claim 6 wherein the resilient securing portions has at least one opening provided on several sides thereof, the opening spacing the resilient securing portions from portions of the first major surface of the housing member.

8. A chip carrier socket comprising:
a housing having a first major surface, a second major surface, and side surfaces extending therebetween;
resilient projections extend from the first major surface to beyond the second major surface, the resilient projections having free ends which are spaced from the second major surface, and fixed ends which are proximate the first major surface;

resilient retention plates provided on the first major surface, the resilient retention plates being integral with the fixed ends of the resilient projections;

openings in the housing provided adjacent the resilient retention plates and proximate the resilient projections, the openings define respective sides of each of the resilient retention plates;

whereby as the resilient projections are forced to move by insertion of a chip carrier into the socket in a direction which is essentially parallel to the diagonal of the housing, the cooperation of the openings with the resilient retention plates cause the resilient retention plates to move accordingly, thereby enabling the resilient projections to have the strength and resilient characteristics to withstand relatively large forces without failure.

9. A chip carrier socket as recited in claim 8 wherein the resilient projections are latching arms which extend at essentially ninety degrees to the resilient retention plates, the free ends of the latching arms having shoulders provided thereon.

10. A chip carrier socket as recited in claim 9 wherein the latch arms extend from the resilient retention plates at a position which is adjacent the openings.

11. A chip carrier socket as recited in claim 8 wherein the resilient retention plates are generally rectangular in configuration, two sides of which have openings provided proximate thereto.

12. A chip carrier socket as recited in claim 8 wherein the resilient projections and the resilient retention plates are moved between a first, unstressed position and a second, stressed position, the first position defined by the retention plate being parallel to the first major surface.

13. A chip carrier socket comprising:
a housing having a first major surface and an oppositely facing second major surface, side walls extend from the first major surface to the second major surface;

securing means having a retention portion and a resilient portion;

the retention portion extending in the same plane and being integral with the first major surface when in a first position, the retention portion having side surfaces provided about the perimeter thereof, several of the side surfaces being integral with the housing, the remaining side surface being spaced from the housing;

the resilient portion being essentially perpendicular to the retention portion to, the resilient portion extending from the retention portion to beyond the second major surface, a free end of the resilient portion being spaced from the retention portion;

whereby the insertion of the chip carrier into the socket causes a force to be applied to the free end portion, such that the resilient portion and the retention portion are both resiliently deformed between a first and a second position.

14. A chip carrier socket as recited in claim 13 wherein the resilient portion is a latching arm which extends at essentially ninety degrees to the retention portion, the free end of the latching arm having a shoulder provided thereon.

15. A chip carrier socket as recited in claim 14 wherein the resilient portion is spaced from the housing by at least on opening which extends from the first major surface of the housing.

16. A chip carrier socket as recited in claim 15 wherein the latch arm extends from the retention portion at a position which is adjacent the openings.

17. A chip carrier socket as recited in claim 13 wherein the retention portion is generally rectangular in configuration, two sides of which have openings provided proximate thereto.

18. A chip carrier socket as recited in claim 17 wherein the resilient portion and the retention portion are moved between a first, unstressed position and a second, stressed position.

19. A chip carrier socket having terminals provided in a chip carrier socket body, the chip carrier socket providing the electrical connection required between a chip carrier housed in a protective handler and a printed circuit board, the chip carrier socket being characterized in that:

portions of first major surface of the chip carrier socket body are resilient retention areas, respective sides of the resilient retention areas are integral with the first major surface, while the remaining sides of the resilient retention areas are spaced from the first major surface, first portions of the resilient retention areas are movable from a first position, in which the first portions are coplanar with the first major surface, to a second position, in which the first portions are not coplanar with the first major surface, resilient projections are integral with and extend from the resilient retention areas, beyond the second major surface of the chip carrier socket body, whereby as the resilient projections have a force applied thereto by the insertion of the chip carrier, the resilient projections are moved, causing the resilient retention areas to move from the first position toward the second position, providing the strength required to prevent the failure of the resilient projections.

* * * * *